(12) United States Patent
Lee

(10) Patent No.: US 6,853,225 B2
(45) Date of Patent: Feb. 8, 2005

(54) DELAY LOCKED LOOP CIRCUIT WITH DUTY CYCLE CORRECTION FUNCTION

(75) Inventor: Seong Hoon Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/315,696

(22) Filed: Dec. 10, 2002

(65) Prior Publication Data

US 2003/0117194 A1 Jun. 26, 2003

(30) Foreign Application Priority Data

Dec. 21, 2001 (KR) ................................. 10-2001-0082673

(51) Int. Cl.[7] .................................................. H03L 7/06
(52) U.S. Cl. ........................ 327/158; 327/149; 327/175
(58) Field of Search ................................. 327/152, 153, 327/158, 149, 161, 170–175

(56) References Cited

U.S. PATENT DOCUMENTS 5,675,620 A * 10/1997 Chen .......................... 375/376
6,125,157 A * 9/2000 Donnelly et al. ........... 375/371
6,452,432 B2 * 9/2002 Kim ............................ 327/158

* cited by examiner

Primary Examiner—Timothy P. Callahan
Assistant Examiner—Cassandra Cox
(74) Attorney, Agent, or Firm—Ladas & Parry LLP

(57) ABSTRACT

A delay locked loop (DLL) circuit having a structure in which a method of performing duty cycle correction (DCC) using two DLLs and an intermediate phase composer and a method of performing DCC by forming a closed loop using a negative feedback are combined with each other is provided. The DLL circuit includes a first DLL for receiving an external clock signal and generating a first clock signal and a second DLL for receiving an external clock signal and generating a second clock signal. The first clock signal and the second clock signal are synchronized with an external clock signal. The DLL circuit further includes an intermediate phase generation circuit for receiving the first and second clock signals and generating an intermediate phase clock signal and a DCC loop for receiving the intermediate phase clock signal and generating an output clock signal. The intermediate phase clock signal has an intermediate phase between the phases of the first and second clock signals. The output clock signal is generated through correction of the duty cycle of the intermediate phase clock signal using a value obtained by integrating the output clock signal.

10 Claims, 14 Drawing Sheets

(a)

(b)

(a)

(b)

(a)

(b)

(a)

(b)

(a) CIRCUIT DIAGRAM  (b) OPERATION WAVEFORM  (c) OPERATION WAVEFORM (a)

(b)

(a)

(b)

(a)

(b)

(c)

DELAY LOCKED LOOP CIRCUIT WITH DUTY CYCLE CORRECTION FUNCTION

BACKGROUND OF THE INVENTION

1. Field of the Invention

The present invention relates to a delay locked loop circuit with a duty cycle correction function.

2. Description of the Prior Art

As generally known in the art, the present invention may particularly be applied to semiconductor memory apparatuses requiring delay locked loop circuits, however, it may also be used for all kinds of semiconductor apparatuses and computer systems requiring delay locked loop circuits.

A delay locked loop (DLL) is a clock generating apparatus for compensating for skew between an external clock and data or an external clock and an internal clock. A conventional DLL with a duty cycle correction (DCC) function is divided into two methods of application. One is a method of realizing negative feedback using a DCC integrator. The other is an open loop method without feedback only in a DCC aspect, in which one more DLL is used.

FIG. 1 is a block diagram of a DLL circuit with a DCC loop realized by the first method. As illustrated in FIG. 1, when an external clock (extclk) is input to a DLL 101, a clock (clkin) whose phase is different from that of the external clock (extclk) by a predetermined amount is generated by the DLL 101 and is provided to a DCC loop 103. In FIG. 1, a loop for feeding back a clock signal (clkout) is a component of the DCC loop 103. However, the loop is illustrated to be separate from the DCC loop 103 in order to clearly represent that a feedback loop exists. The duty cycle of the clock clkin is compensated for by the DCC loop 103. The output clock clkout generated as a result is provided to the outside through an output port of a DLL circuit 100.

FIG. 2 is a block diagram illustrating an example of a differential method of a DLL circuit in FIG. 1. In FIG. 2, CLK and CLKb denote differential signals of an external clock signal. The differential signal CLKb is obtained by inverting the differential signal CLK. IN and Inb denote differential signals of a clock clkin. The differential signal Inb is obtained by inverting the differential signal IN. OUT and OUTb denote differential signals of the output clock clkout. The differential signal OUTb is obtained by inverting the differential signal OUT. As illustrated in FIG. 2, the DLL 101 includes a variable delay line 201 and a phase determiner 209. The DCC loop 103 includes a differential DCC amplifier 203, a level correction amplifier 205, and a DCC integrator 207. An input buffer 211 for converting a clock signal input from the outside into a signal level for an internal circuit can be further included. The phase determiner 209 receives external clocks CLK and CLKb and output clocks OUT and OUTb and determines a phase difference between the external clocks and the output clocks, to thus generate a control signal CTRL for controlling a delay amount in a variable delay line 201. In general, the variable delay line 201 delays the external clocks CLK and CLKb by the delay amount determined by a control signal CTRL so that the external clocks CLK and CLKb have the same phases as those of the output clocks OUT and OUTb. The delayed clocks IN and Inb are provided to a differential DCC amplifier 203 forming the DCC loop 103 in order to compensate for the duty cycle.

The operation of the DCC loop 103 will now be described with reference to FIG. 3. FIG. 3A illustrates the DCC loop in FIG. 2 for the convenience of understanding. FIG. 3B illustrates waveforms of the operations of the DCC loop. When the duty ratios of the clocks IN and Inb are not 50%, a DCC integrator 207 integrates the output clocks OUT and OUTb, to thus generate voltage signals $V_{DCC}$ and $V_{DCCb}$ reflecting the output clocks OUT and OUTb, and provides the voltage signals $V_{DCC}$ and $V_{DCCb}$ to the differential DCC amplifier 203. The differential DCC amplifier 203 controlled by the voltage signals $V_{DCC}$ and $V_{DCCb}$ applies different direct current voltages to high intervals and low intervals of the clocks IN and Inb, to thus generate clocks $IN_{DCC}$ and $IN_{DCCb}$. As illustrated in FIG. 3B, in the clocks $IN_{DCC}$ and $IN_{DCCb}$, high levels and low levels have different values but the same period. Hereinafter, the clocks $IN_{DCC}$ and $IN_{DCCb}$ are referred to as "interval correction clock signals". An output buffer (or a level correction amplifier) 205 receives the clocks $IN_{DCC}$ and $IN_{DCCb}$ and causes the absolute values of the high level and the low level to be equal, to thus generate the output clocks OUT and OUTb. Hereinafter, the clocks OUT and OUTb are referred to as "level correction clock signals". The level correction amplifier 205 operates as an output buffer. Accordingly, the duty cycle is compensated for by a DCC loop 300.

FIG. 4A is a circuit diagram of an example of the DCC integrator 207 in FIG. 3. FIG. 4B illustrates a waveform of the operation of the DCC integrator. As illustrated in FIG. 4A, the DCC integrator 207 may include two current sources $I_{DCC}$, two switches $S_L$ and $S_H$, and a capacitor C1 or C2. When the output clock OUT is used for controlling switches, the switch $S_L$ is turned on in a low interval of the output clock OUT and the switch $S_H$ is turned on in a high interval. It is possible to control switches using the output clock OUTb. When the output clock OUT is used for controlling the switches $S_L$ and $S_H$ and a low interval is longer than a high interval as illustrated in FIG. 4B in the output clock OUT, the time for which the switch $S_L$ is turned on is longer than the time for which the switch $S_H$ is turned on. Therefore, charges are accumulated in the capacitor C1. Accordingly, the magnitude of the voltage signal $V_{DCC}$ gradually increases. Meanwhile, because charges are discharged from the capacitor C2, the magnitude of the voltage signal $V_{DCCb}$ gradually decreases. When the duty cycle is not adjusted, the voltage signals $V_{DCC}$ and $V_{DCCb}$ change in proportionate to the duty cycle. When the duty cycle is adjusted, the voltage signals $V_{DCC}$ and $V_{DCCb}$ do not change and maintain a certain value.

FIG. 5 is a circuit diagram of an example of the differential DCC amplifier in FIG. 3. FIG. 6 is a circuit diagram of an example of an output buffer. Such a method has an advantage of obtaining a high level of correctness but has a disadvantage of increasing errors as a frequency becomes lower because locking time is long and an applicable bandwidth is not very wide. This is because toward low frequencies $\Delta V_{DCC(b)}$ or $\Delta V_{DCCb}$, corresponding to a duty cycle error, becomes larger beyond an allowable range toward a low frequency.

FIG. 7A is a block diagram of a DCC circuit using two duty locked loops, which is realized by a second method. FIG. 7B illustrates waveforms of the operations of the DCC circuit. The DCC circuit according to the present method includes two DLLs 601 and 603 and an intermediate phase generator 605 as illustrated in FIG. 7A. The DLL 601 outputs a clock (clk1) for the external clock (extclk). The DLL 603 outputs a clock (clk2). The clock (clk1) is obtained by inverting the clock clk2. As illustrated in FIG. 7B, the clock clk1 and the clock clk2 have a relationship in which the high level start edge, the rising edge of a level with a duty of (50−Δ)% in the clock clk1, and the low level start edge, the falling edge of a level with a duty of (50+Δ)% in the clock clk2, occur at the same point of time. The two clocks clk1 and clk2 generated from a DLL block 607 are provided to an intermediate phase generator 605. A clock clkout having an intermediate phase between the two clocks clk1 and clk2 is generated from the intermediate phase generator 605. As illustrated in FIG. 7B, the rising edge of the clock clkout is generated the moment that the rising edge of the clock clk1 and the falling edge of the clock clk2 are generated. The falling edge of the clock clkout has an intermediate phase between the falling edge of the clock clk1 and the rising edge of the clock clk2. What is important is that gate delay in the intermediate phase generator 605 is not considered. In this method, a DCC function is completed through composing of the outputs of the two DLLs 601 and 603. This method is an open loop method only in a DCC aspect. That is, a feedback loop of correcting duty errors little by little, monitoring the duty errors, and making certain that an amount needing correction does not exist.

FIG. 8A is a detailed block diagram of an example of the DCC circuit in FIG. 7. FIG. 8B illustrates waveforms of the operations of the DCC circuit. The first DLL 601 of FIG. 7 includes a first delay line 801 and a first phase determiner 803. The second DLL 603 includes a second delay line 805 and a second phase determiner 807. A buffer 811 of an output port can be omitted if necessary or may have another type. A first dummy delay 813 is inserted into the loop of the second DLL 603 in order to model the time delay of a clock signal in an intermediate phase generator 809. A second dummy delay 815 is inserted into the loop of the second DLL 603 in order to model the time delay of a clock signal in an output buffer 811. When the differential signals CLK and CLKb corresponding to the external clock extclk are provided to an input buffer 817, the input buffer 817 converts the clock signals CLK and CLKb into an internal clock rCLK suitable for an internal circuit and provides the clock signals CLK and CLKb to the first and second delay lines 801 and 805. The internal clock rCLK is delayed by the first and second delay lines 801 and 805 for a predetermined time, becomes the clock clk1 and the clock clk2, and is input to the intermediate phase generator 809. The external clock CLK is provided to the first phase determiner 803 and the second phase determiner 807. The first phase determiner 803 receives the output clock clkout and determines a phase difference between the external clock CLK and the output clock clkout, to thus generate a first control signal CTRL1 for displaying the phase difference, and provides the first control signal CTRL1 to the first delay line 801. A delay amount in the first delay line 801 of the internal clock rCLK is determined by the control signal CTRL1. The second phase determiner 807 receives a feedback clock fbclk2 obtained by the clock clk2 generated by the internal clock rCLK being delayed through the second delay line 805 passing through the first dummy delay 813 and the second dummy delay 815. The first dummy delay 813 does not have a function of generating a signal having an intermediate phase between the received two signals, however, is a circuit for modeling time delay of a clock in the intermediate phase generator 809. The second dummy delay 815 is a circuit for modeling time delay of a clock in an output buffer 811. The second phase determiner 807 detects a phase difference between the external clock CLK and the feedback clock fbclk2, generates a second control signal CTRL2 corresponding to the phase difference, and provides the second control signal to the second delay line 805. The delay amount of an internal clock Rclk2 in the second delay line 805 is determined by the second control signal CTRL2. A small circle toward the output port means inversion of a signal in the second delay line 805. Therefore, the second delay line 805 delays the inverted internal clock rCLK for a predetermined time. As illustrated in FIG. 8B, the circuit of FIG. 8A is formed so that the high level of the start edge, the rising edge of a level with a duty of (50−Δ)% in the clock clk1, and the low level of the start edge, the falling edge of a level with a duty of (50+Δ)% in the clock clk2, occur at the same point of time. The rising edge of the output clock clkout is generated with a time difference corresponding to gate delays at the intermediate phase generator 809 and the output buffer 811 from the rising edges of the clocks clk1 and clk2. The falling edge is also generated with the time difference in an intermediate phase between the falling edge of the clock clk1 and the falling edge of the clock clk2.

The intermediate phase generator 809 is a kind of phase composer. FIG. 9A is a circuit diagram of an example of a non-differential method. FIG. 9B illustrates waveforms of the operations of the intermediate phase generator 809, which are generated at the point of time where the widths of the received two clocks are the same and the rising edge and the falling edge are different from each other. FIG. 9C illustrates waveforms of the operations of the intermediate phase generator 809, which are generated at the point of time where the widths of the received two clocks are different and the rising edge and the falling edge are the same as each other. As illustrated in FIG. 9A, the present circuit is only formed from an inverter. In FIG. 9A, a part 901 marked with a dotted line corresponds to the intermediate phase generator. The remaining parts are for easily understanding the operation of the present circuit. When the phase of an input signal $\Phi_{Ain}$ leads the phase of another input signal $\Phi_{Bin}$, output waveforms are as illustrated in FIG. 9B. The phase of an output signal $\Phi_{AB}$ can be adjusted to the middle of the remaining two phases $\Phi_A$ and $\Phi_B$. As illustrated in FIG. 9C, the phases of the rising edges coincide and the phases of the falling edges are different from each other. The result illustrated in FIG. 9C can be obtained. The gate delay was not considered in FIGS. 9B and 9C. FIG. 10 is a circuit diagram illustrating an example of a differential method of an intermediate phase generator. In FIG. 10, k may have a real number value no less than 0 and no more than 1 as a phase composition weight value. When an intermediate phase generator 1000 is an ideal linear circuit, it is possible to obtain a desired intermediate phase when k=0.5.

As noted from the above, according to the second method, an additional time for DCC locking is not necessary because the DCC function is realized by using one more DLL. The second method can be easily realized by a digital or non-differential method. However, the characteristic of the intermediate phase generator is not actually linear. It is not possible to avoid the DCC errors generated by changes in voltage and temperature. Also, such errors increase toward low frequencies.

SUMMARY OF THE INVENTION

Accordingly, the present invention has been made to solve the above-mentioned problems occurring in the prior art, and an object of the present invention is to provide a delay locked loop (DLL) circuit where a locking time is relatively short.

Another object of the present invention is to provide a DLL circuit with a duty cycle correction (DCC) function, in which a locking time is relatively short and which is capable of obtaining high correctness.

Still another object of the present invention is to provide a DLL circuit with a DCC function, in which a range of an applicable frequency is relatively wide.

In order to accomplish these objects, there is provided a delay locked loop (DLL) circuit with a duty cycle correction (DCC) function, comprising a first DLL for receiving an external clock signal and generating a first clock signal and a second DLL for receiving an external clock signal and generating a second clock signal. The first and second clock signals are synchronized with an external clock signal. The second clock signal is obtained by inverting the first clock signal. The DLL circuit with the DCC function further comprises an intermediate phase generation circuit for receiving the first and second clock signals and generating an intermediate phase clock signal as well as a DCC loop for receiving the intermediate phase clock signal and generating an output clock signal. The intermediate phase clock signal has an intermediate phase between those of the first and second clock signals. The output clock signal is generated through correction of a duty cycle of the intermediate phase clock signal using a value obtained by integrating the output clock signal. According to such a structure, the above-described first conventional method of performing DCC by forming a closed loop using a negative feedback is combined with the above-described second conventional method of performing DCC using two DLLs and an intermediate phase composer. Accordingly, it is possible to obtain the advantages of the two methods. That is, it is possible to obtain a short locking time, high correctness of duty cycle correction, and a wide applicable bandwidth.

Preferably, a start edge of a level having a duty of $(50-\Delta)\%$ in the first clock signal and a start edge of a level having a duty of $(50+\Delta)\%$ in the second clock signal are generated at the same point of time or a start edge of a level having a duty of $(50+\Delta)\%$ in the first clock signal and a start edge of a level having a duty of $(50-\Delta)\%$ in the second clock signal are generated at the same point of time. Accordingly, it is possible to avoid a case where only a clock signal of an intermediate phase is generated by an intermediate phase generation circuit, while maintaining a phase difference between two clock signals provided to the intermediate phase generation circuit. That is, according to such a characteristic, a phase difference between two clock signals provided to the intermediate phase generation circuit is gradually reduced. Accordingly, a probability of generating errors is reduced.

The DCC loop comprises a DCC integrator for receiving and integrating the output clock signal, to thus generate a duty cycle control signal and a DCC amplifier for receiving the intermediate phase clock signal and generating an interval adjusted clock signal. The interval adjusted clock signal is obtained by separately amplifying the high interval and the low interval of the intermediate phase clock signal according to the duty cycle control signal. The DCC amplifier is a circuit for applying a larger voltage to the high interval of the intermediate phase clock signal than a voltage applied to the low interval of the intermediate phase clock according to the duty cycle control signal. The DCC loop may further comprise a level correction amplifier for generating a level adjusted clock signal by receiving and amplifying an interval adjusted clock signal. The level adjusted clock signal causes the absolute values of the high level and the low level to have the same value in the interval adjusted clock signal. The duty cycle control signal does not change when the duty of the output clock signal is 50%.

Preferably, the DLL circuit further comprises a small swing buffer for generating a small swing output clock signal by receiving the output clock signal and reducing swing width of the output clock signal and providing the small swing output clock signal to the DCC integration circuit as an output clock signal. Accordingly, it is possible to easily maintain linearity in a DCC integrator commonly realized by an analog circuit.

According to another aspect of the present invention, a DLL circuit with a DCC function comprises a phase mixing circuit for receiving the first and second clock signals and a phase mixing weight control signal instead of an intermediate phase generation circuit and the DCC loop and mixing the phase of the first clock signal with the phase of the second clock signal according to the phase mixing weight control signal and a DCC integration circuit for receiving and integrating the output clock signal, generating an integration value signal, and providing the integration value to the phase mixing circuit as the phase mixing weight control signal.

Preferably, the DLL circuit further comprises a phase mixing control circuit for receiving the integration value signal, converting the integration value signal by a predetermined method, generating a converted integration value signal, and providing the converted integration value signal to the phase mixing circuit as the phase mixing weight control signal. Accordingly, it is possible to adopt more various types of phase mixing circuits because it is possible to apply the output of a DCC integrator to the phase mixing circuit by appropriately converting the output without directly applying the output of the DCC integrator to the phase mixing circuit.

Preferably, the DLL circuit further comprises a first phase splitter for receiving the output clock signal and generating a first phase-split output clock signal and a second phase-split output clock signal having a phase difference of 180°. The DCC integration circuit is a differential circuit for receiving and integrating the first and second phase split output clock signals. Accordingly, it is possible to increase correctness of circuit operation because it is possible to remove a common mode signal such as noise.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
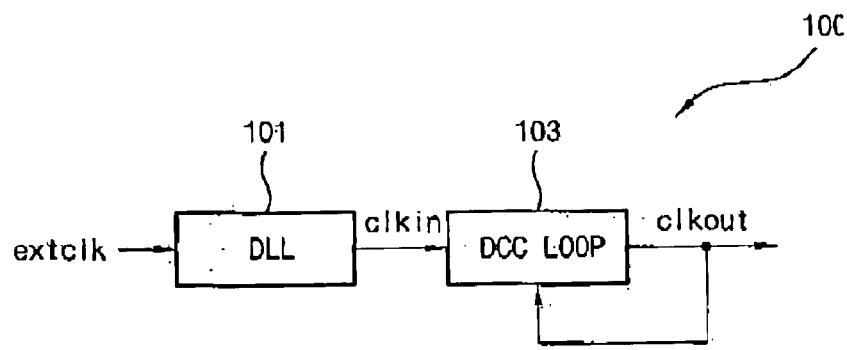
FIG. 1 is a block diagram of a conventional delay locked loop (DLL) circuit with a duty cycle correction (DCC) loop.
Figure 2:
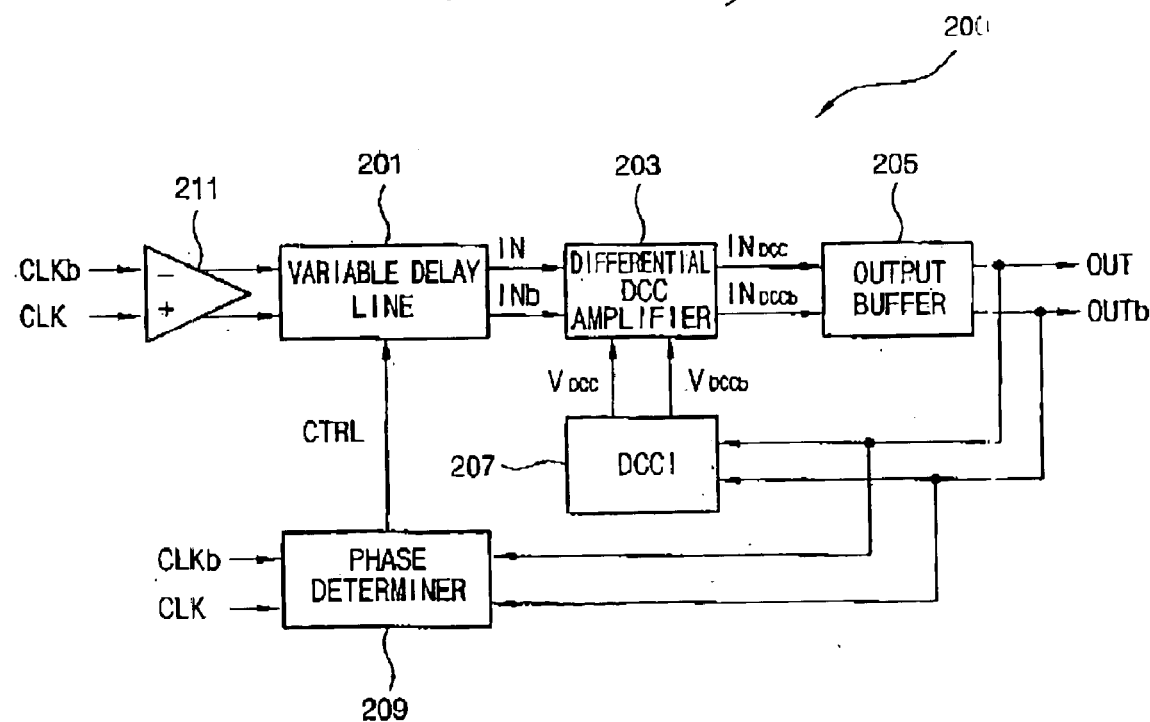
FIG. 2 is a block diagram illustrating an example of a differential method of the DLL circuit in FIG. 1.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 11:
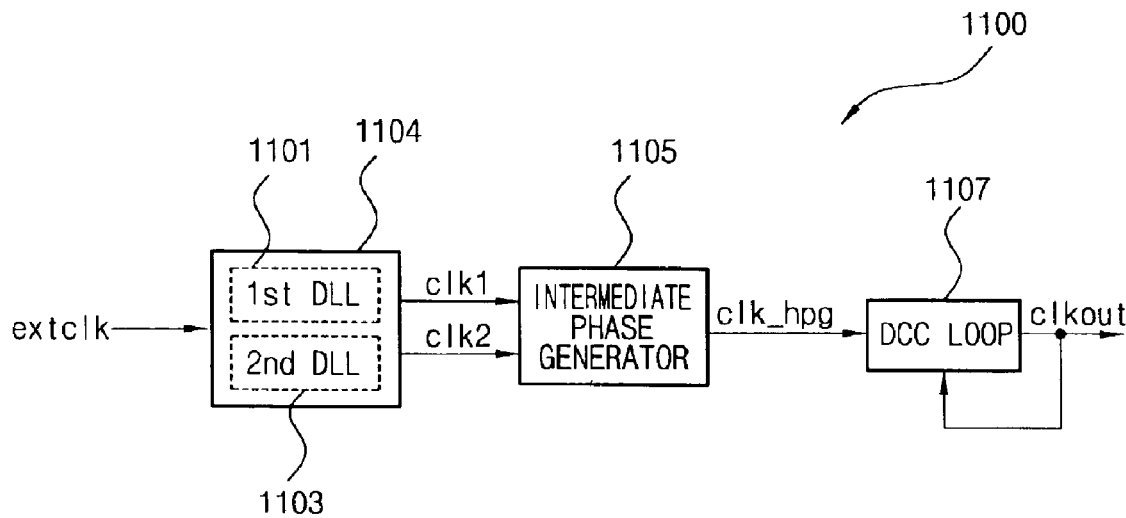
FIG. 11 is a block diagram of a DLL circuit with a DCC function according to an embodiment according to the present invention.

FIG. 11 is a block diagram of a delay locked loop (DLL) circuit with a duty cycle correction (DCC) function according to an embodiment of the present invention. As illustrated in FIG. 11, a DLL circuit according to the present embodiment includes a DLL block 1104 including two DLLs 1101 and 1103, an intermediate phase generator 1105, and a DCC loop 1107. That is, a conventional DCC circuit including the two DLLs 1101 and 1103 and the intermediate phase generator 1105 and a conventional DCC circuit including the DCC loop 1107 are combined with each other.

Figure 3:
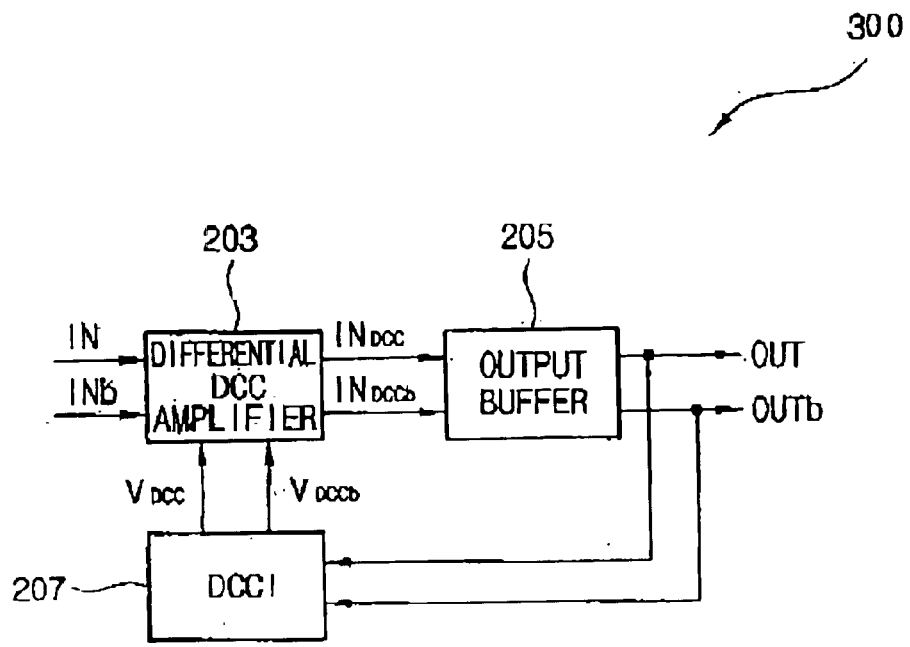
FIG. 3 illustrates the DCC loop in FIG. 2 and waveforms of the operations of the DCC loop.
Figure 3:
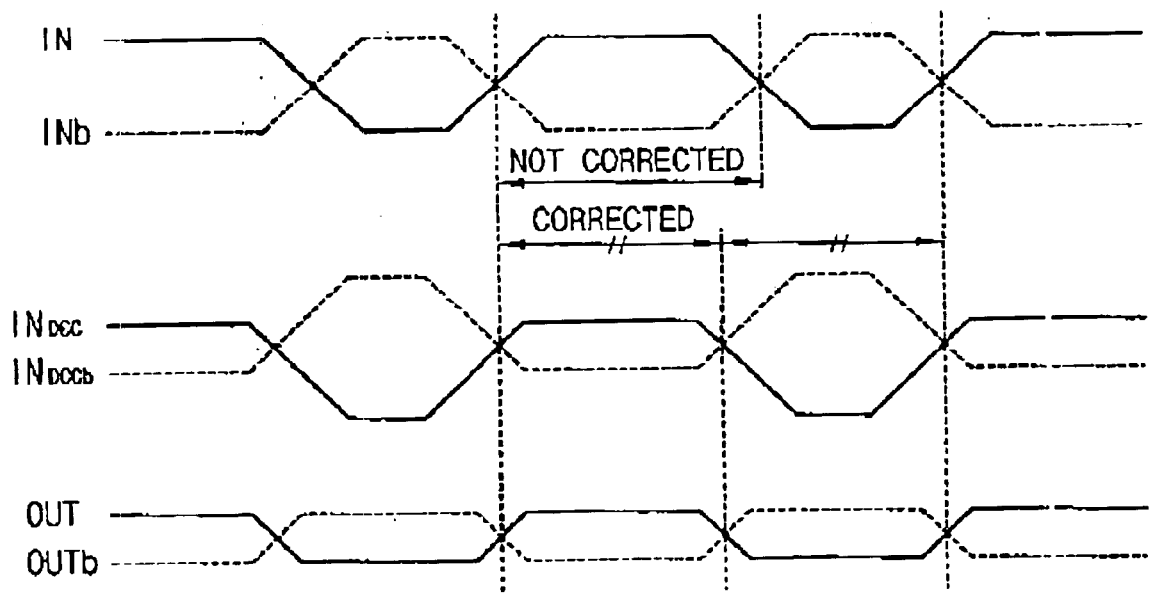
Figure 8:
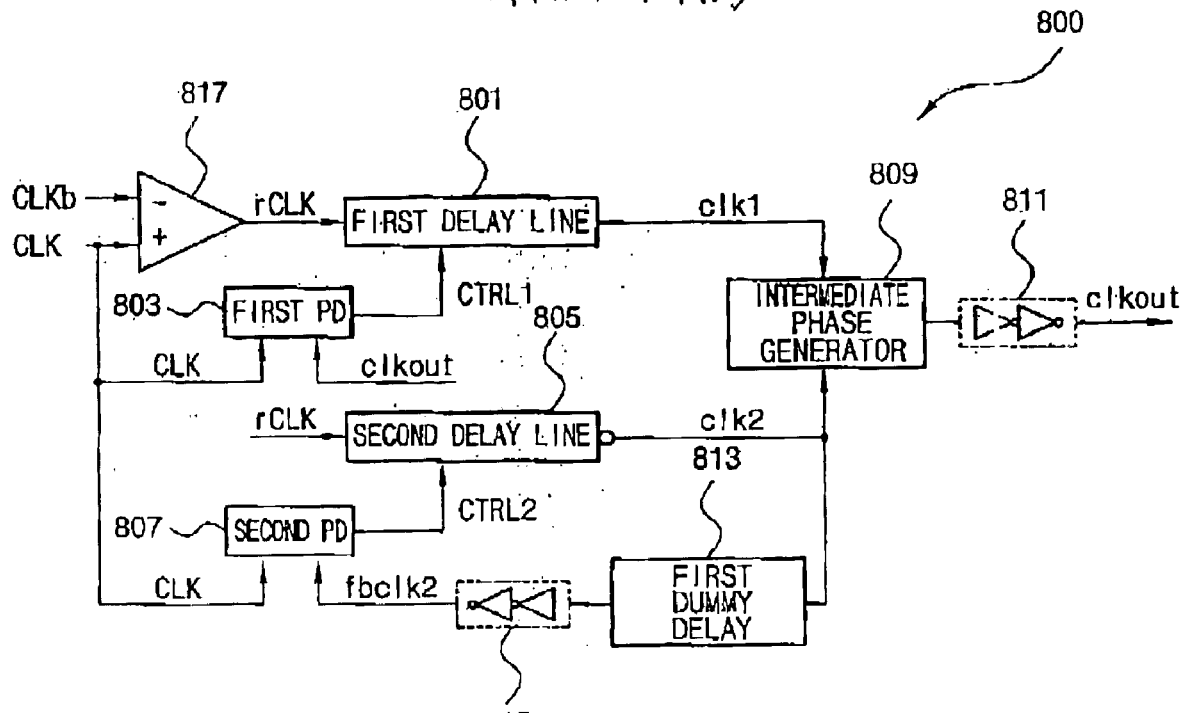
FIG. 8 is a detailed block diagram of the DCC circuit in FIG. 6 and illustrates waveforms of the operations of the DCC circuit.
Figure 8:
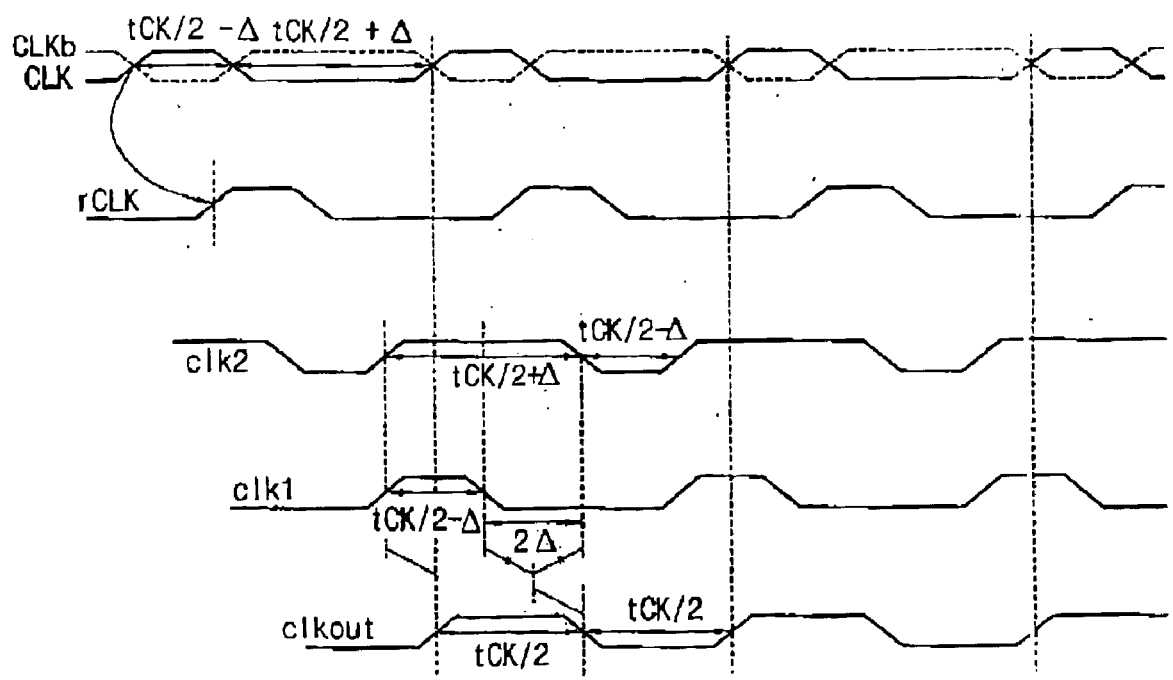
Figure 9:
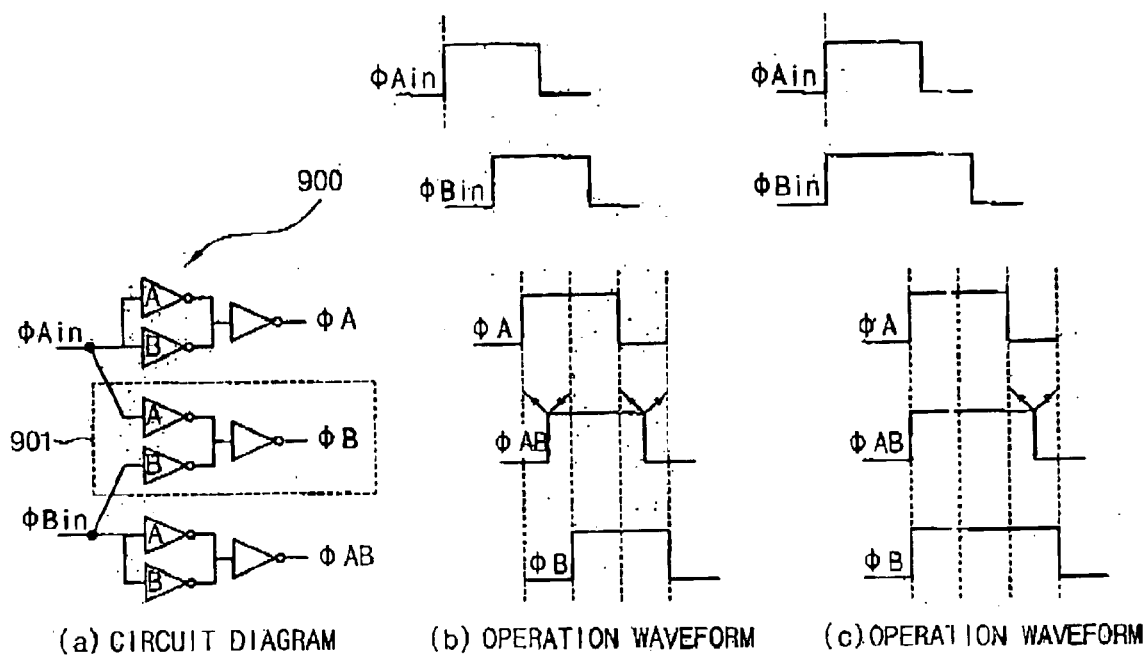
FIG. 9 is a circuit diagram illustrating an example of the non-differential method of the intermediate phase generator in FIG. 7 and illustrates waveforms of the operations of the intermediate phase generator.

The circuit of FIG. 11 operates as follows. A front part including the two DLLs 1101 and 1103 and the intermediate phase generator 1105 is the same as illustrated with reference to FIG. 8. A rear part including the DCC loop 1107 is the same as illustrated with reference to FIG. 3. As described with reference to FIG. 8, the first DLL 1101 receives an external clock extclk and provides a clock clk1 synchronized with the external clock extclk to the intermediate phase generator 1105. The second DLL 1103 generates a clock clk2 and provides the clock clk2 to the intermediate phase generator 1105. The clock clk1 and the clock clk2 are in a relationship where falling edges or rising edges are simultaneously generated as illustrated in FIG. 8B. The intermediate phase generator 1105 receives the two clocks clk1 and clk2 and generates a clock clk_hpg having an intermediate phase. The output clock of the intermediate phase generator 1105 has a waveform whose duty cycle is more often corrected than the duty cycles of the clocks clk1 and clk2 as marked with clkout in FIG. 8B. Locking time is short because the duty cycle is corrected in a procedure of composing an intermediate phase from the outputs of the two DLLs 1101 and 1103 without passing through a feedback circuit. Because the DCC loop 1107 only has to correct the error of an output clk_hpg of the intermediate phase generator 1105, the burden is much less than that of the DCC circuit including only the DCC loop. Therefore, an overall circuit has a short locking time and a usable frequency band is wider.

Figure 12:
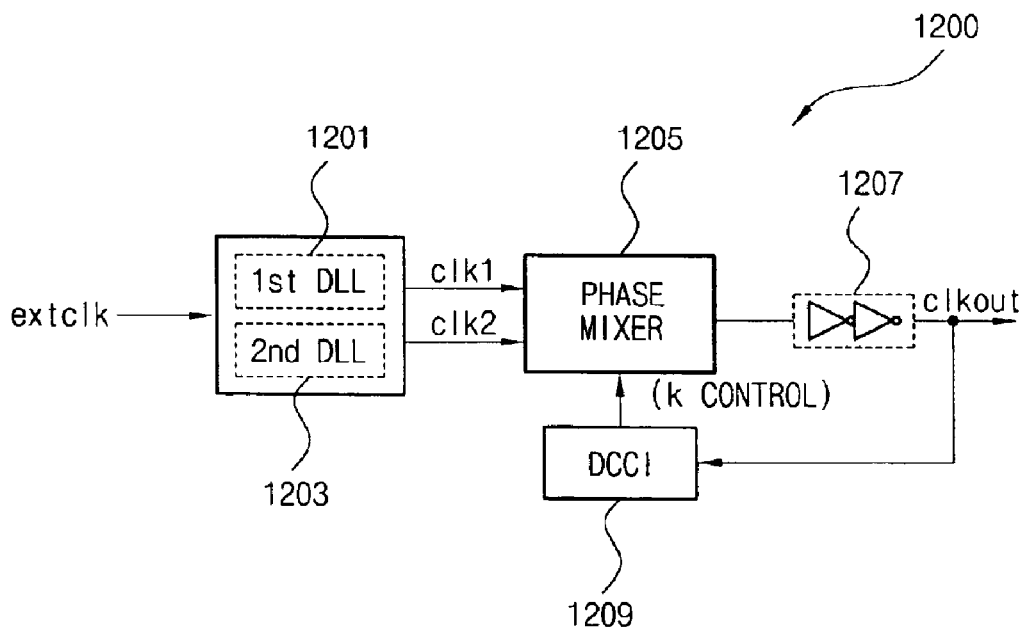
FIG. 12 is a block diagram of a DLL circuit with a DCC function according to another embodiment according to the present invention.

FIG. 12 is a block diagram of a DLL circuit with a DCC function according to another embodiment of the present invention. The embodiment is a method of including the intermediate phase generator 1105 in FIG. 11 in the DCC loop 1107. By doing so, it is possible to make a circuit simpler than the simple combination type of FIG. 11. An output buffer 1207 is omitted or may constitute another type.

Figure 4:
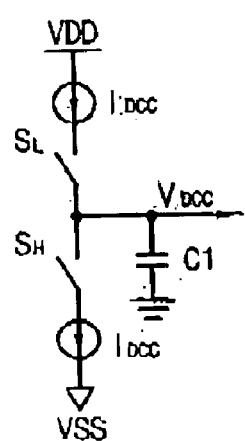
FIG. 4 is a circuit diagram of the DCC integrator in FIG. 3 and illustrates a waveform of the operation of the DCC integrator.
Figure 4:
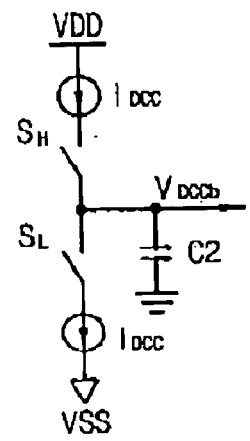
Figure 4:
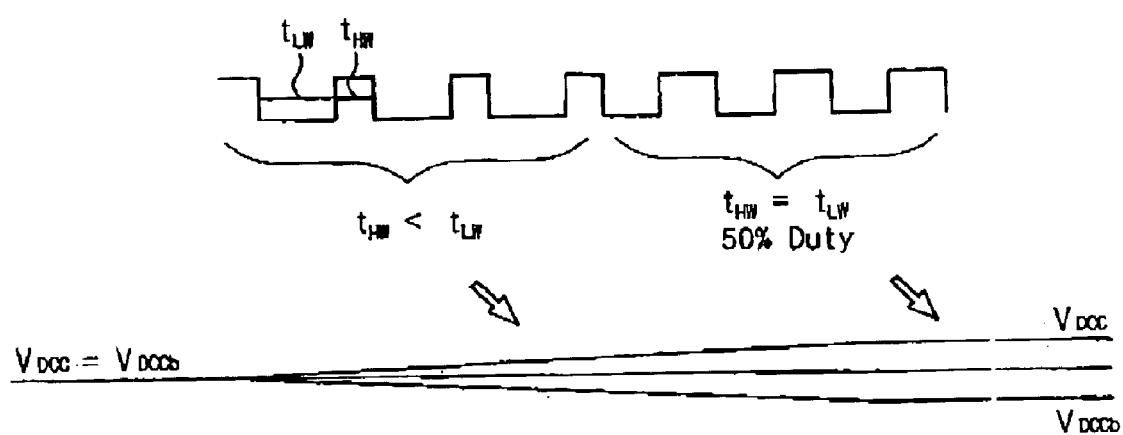
Figure 5:
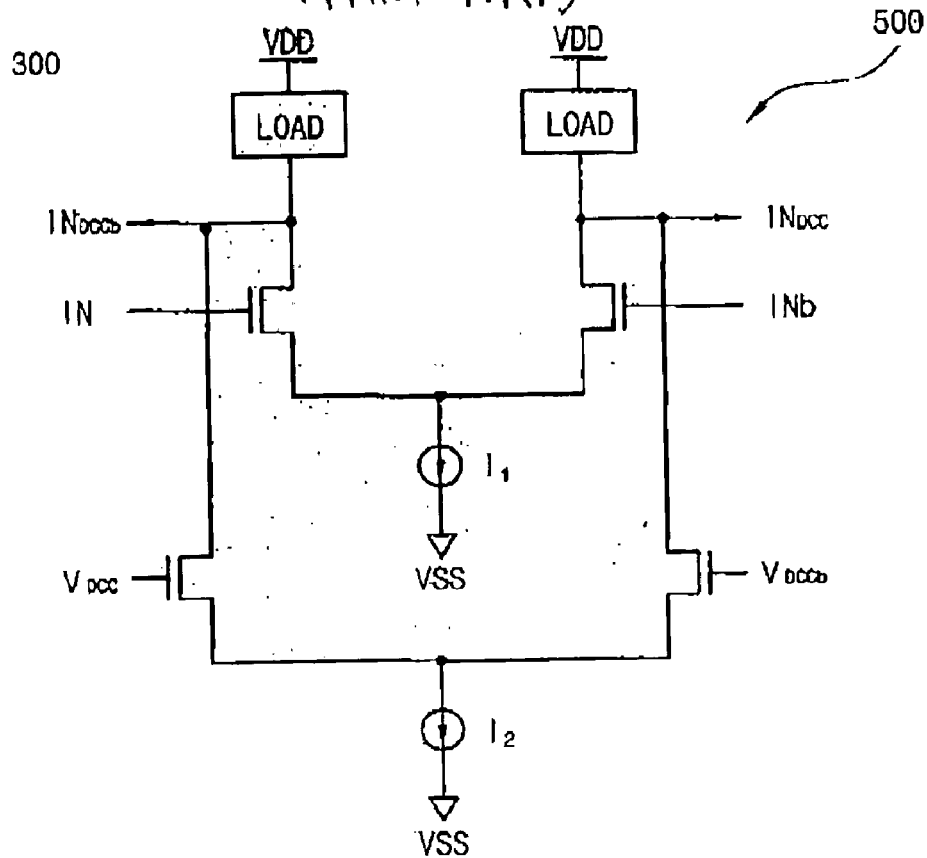
FIG. 5 is a circuit diagram of an example of the differential DCC amplifier in FIG. 3.
Figure 6:
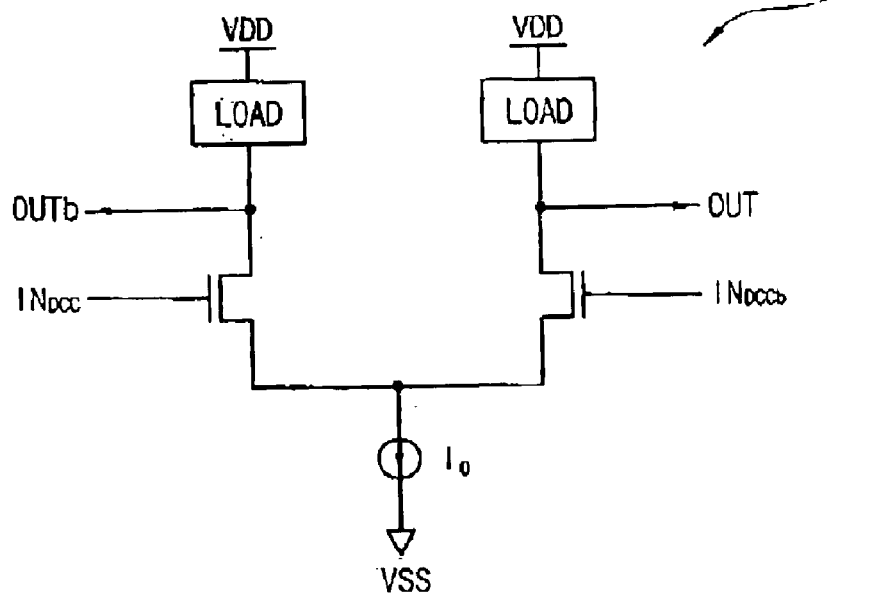
FIG. 6 is a circuit diagram of an example of the level correction amplifier in FIG. 3.
Figure 7:
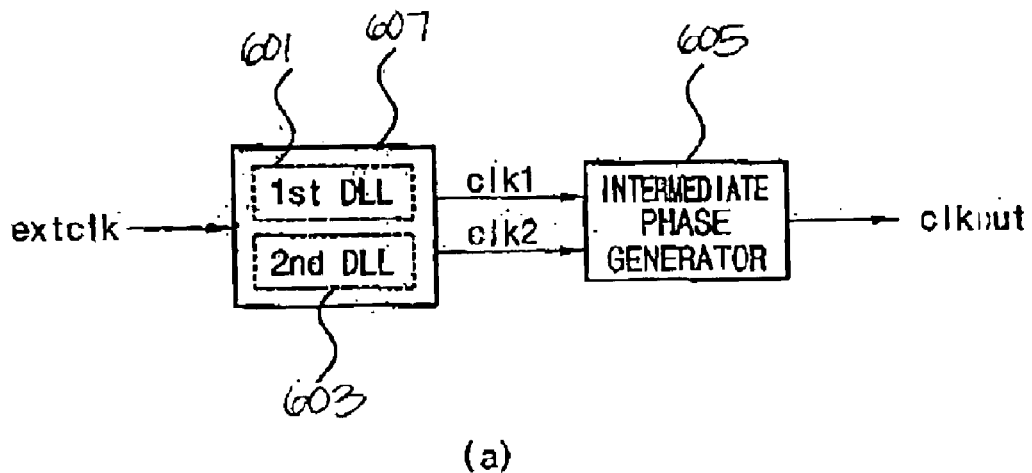
FIG. 7 is a block diagram of a conventional DCC circuit using two duty locked loops and illustrates waveforms of the operations of the DCC circuit using two duty locked loops.
Figure 7:
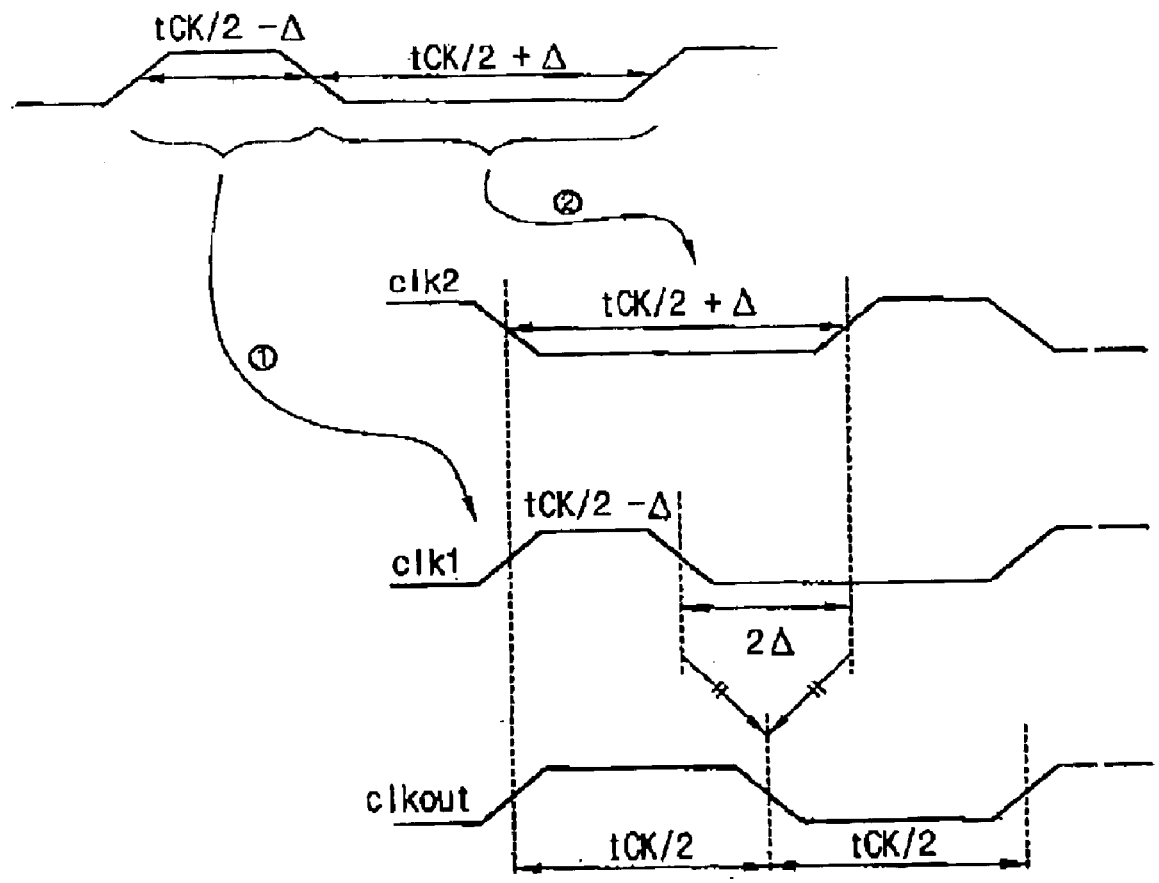
Figure 10:
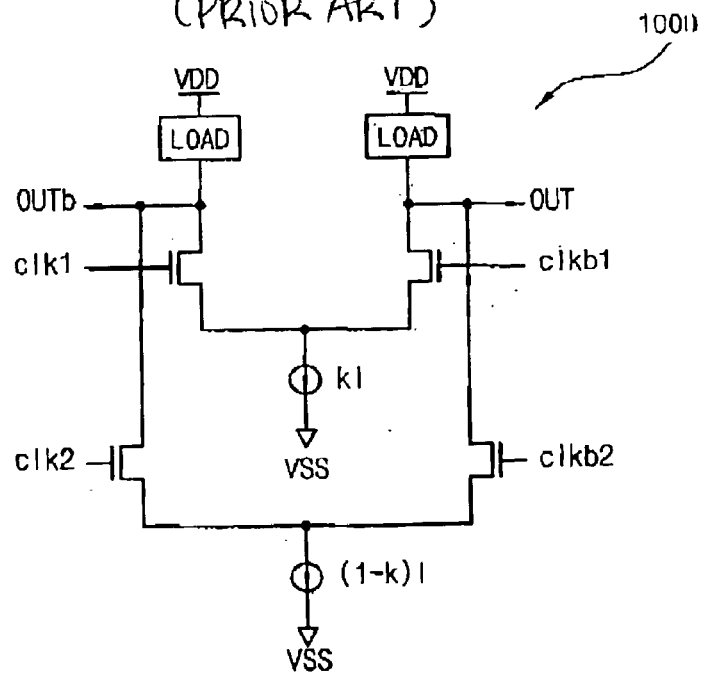
FIG. 10 is a circuit diagram illustrating an example of the differential method of the intermediate phase generator in FIG. 7.

A phase mixer 1205 is similar to the intermediate phase generator 1105, however, it is different from the intermediate phase generator 1105 in that a degree, to which the received two clocks clk1 and clk2 affect a phase composition procedure, varies according to a phase composition weight value k. When gate delay in the phase mixer 1205 is ignored, for example, when k=1, the output of the phase mixer 1205 has the same phase as that of the clock clk1. When k=0.5, the output of the phase mixer 1205 has an intermediate phase between the two clocks clk1 and clk2. When k=0, the output of the phase mixer has the same phase as that of the clock clk2. The output clock clkout is fed back and is provided to a DCC integrator 1209. The DCC integrator 1209 generates a direct current (DC) voltage according to a duty cycle by integrating the output clock clkout as previously illustrated with reference to FIG. 4 and provides the DC voltage to the phase mixer 1205, t thus control the phase-mixed weight value k in the phase mixer 1205. As illustrated with reference to FIG. 10, k is fixed to about 0.5 in a conventional intermediate phase composer. However, in the phase composer 1205 according to the present invention, k is controlled according to the output of the DCC integrator 1209, to thus precisely correct a duty cycle.

Figure 13:
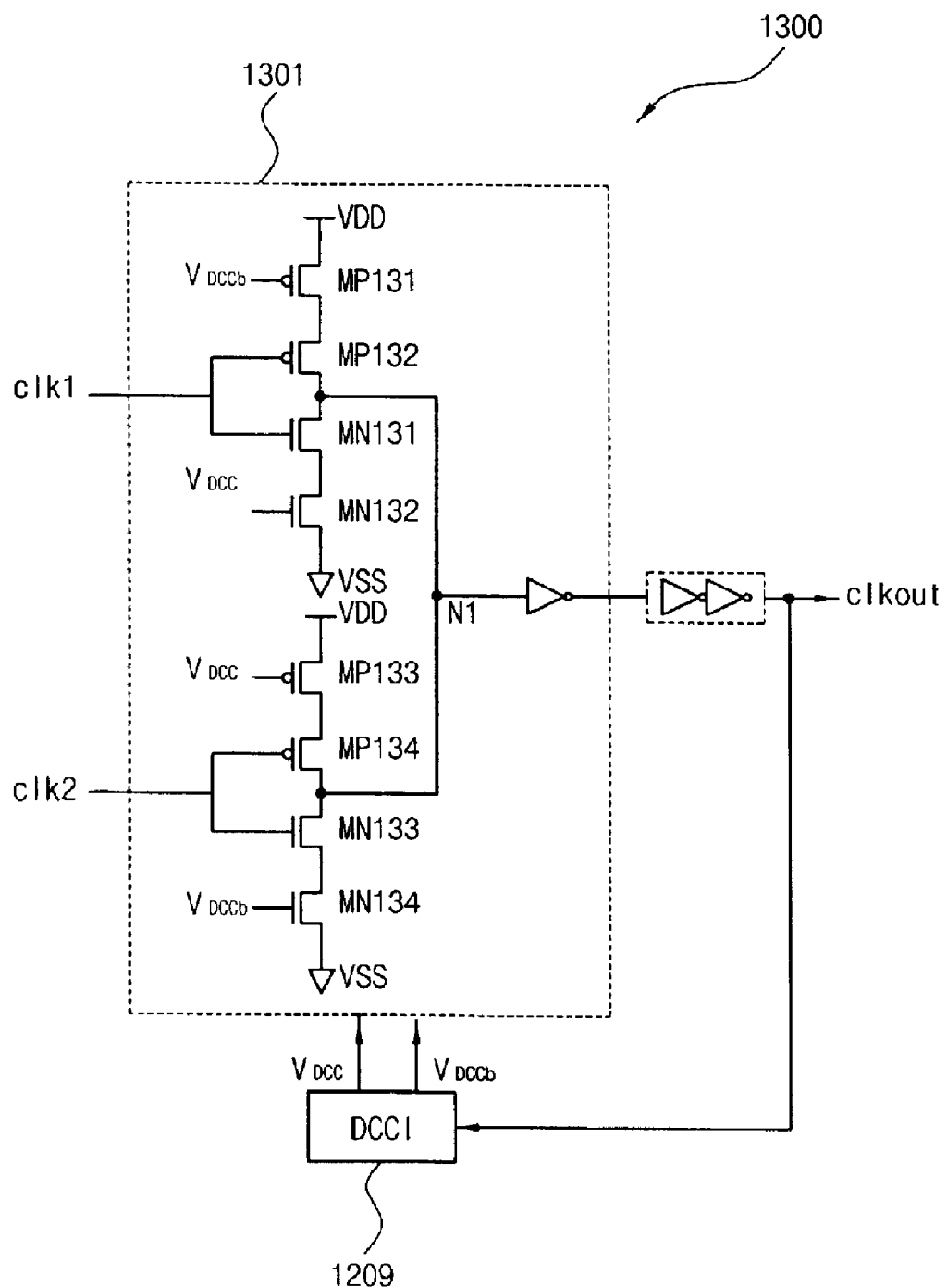
FIG. 13 is a circuit diagram illustrating an example using a phase mixer of a non-differential method in the DCC loop in FIG. 12.

Phase mixer 1205 may include various types such as a digital type, an analog type, a differential type and a non-differential type. FIG. 13 is a circuit diagram illustrating an example of a phase mixer according to a non-differential method. As illustrated in FIG. 13, a phase mixer 1300 may have an inverter type. A composition weight value varies according to signals $V_{DCC}$ and $V_{DCCb}$. Thus, it is possible to remove duty errors by controlling the signals $V_{DCC}$ and $V_{DCCb}$ according to a situation. A PMOS transistor MP132 and an NMOS transistor MN 131 form an inverter for the clock signal clk1. A PMOS transistor MP134 and an NMOS transistor MN133 form an inverter for the clock signal clk2.

When the output clock clkout is fed back and is provided to the DCC integrator 1209, the DCC integrator 1209 integrates the output clock clkout, to thus generate the signals $V_{DCC}$ and $V_{DCCb}$ representing the duty cycle of the output clock clkout, and provides the signals $V_{DCC}$ and $V_{DCCb}$ to a phase mixer 1301. In the phase mixer 1301, the signal $V_{DCC}$ is provided to the gate of the NMOS transistor NM132 for the clock clk1 and is provided to the gate of the PMOS transistor MP133 for the clock clk2. Meanwhile, the signal $V_{DCCb}$ is provided to the gate of the PMOS transistor MP131 for the clock clk1 and is provided to the gate of the NMOS transistor MN134 for the clock clk2. Therefore, for example, when the signal $V_{DCC}$ is larger than the signal $V_{DCCb}$ as illustrated in FIG. 4B, the output signal clkout close to the phase of the clock clk1 passes through a node N1. As the signal $V_{DCC}$ is larger than the signal $V_{DCCb}$, the phase of the output signal clkout is closer to the phase of the clock clk1. When the signal $V_{DCCb}$ is larger than the signals $V_{DCC}$, the output signal clkout close to the phase of the clock clk2 comes out.

FIG. 14A is a block diagram of another embodiment, in which a phase mixer controller is added to the DCC loop of FIG. 13. FIG. 14B is a circuit diagram of an example of a phase mixer controller. FIG. 14C is a circuit diagram of an example of a phase mixer. As noted from FIG. 14A, the output signals $V_{DCC}$ and $V_{DCCb}$ of the DCC integrator 1209 are not directly provided to the phase mixer 1205 as illustrated in FIG. 12 but are provided to a phase mixer controller 1401. The phase mixer controller 1401 receives the signals $V_{DCC}$ and $V_{DCCb}$, generates new signals VP1, VN1, VP2, and VN2 by appropriately converting the signals $V_{DCC}$ and $V_{DCCb}$ as needed, and provides the new signals VP1, VN1, VP2, and BN2 to the phase mixer 1205. By doing so, it is possible to adopt more various types of phase mixer. The phase mixer controller 1401 is a circuit that varies according to the used phase mixer 1205. The phase mixer controller illustrated in FIG. 14B is only an example. A phase mixer 1400c illustrated in FIG. 14C is the same as a circuit 1300 of FIG. 13 excluding that the signals VP1, VN1, VP2, and VN2 are used instead of the signals $V_{DCC}$ and $V_{DDCb}$.

Figure 14:
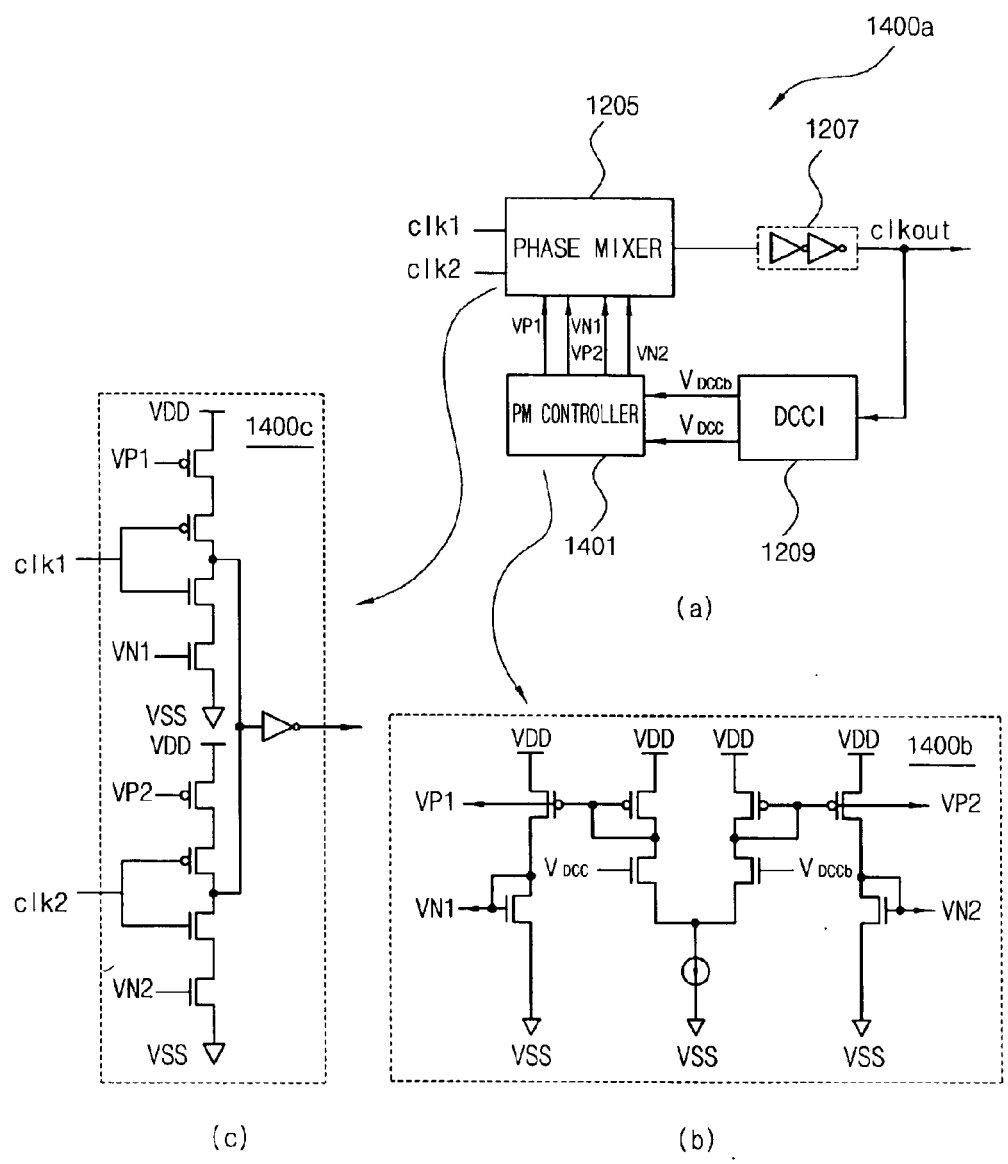
FIG. 14 is a block diagram of another embodiment, where a phase mixer controller is added to the DCC loop of FIG. 13, a circuit diagram of a phase mixer controller, and a circuit diagram of a phase mixer.

FIG. 15A is a block diagram of another embodiment, in which a small swing buffer is added to the DCC loop of FIG. 14. FIG. 15B is a circuit diagram of a small swing buffer. As illustrated in FIG. 15A, the output clock clkout is not directly provided to the DCC integrator 1209 but is provided via a small swing buffer 1501. In FIG. 15A, the output clock clkout is a non-differential signal that full swings between a power source voltage VDD and a ground voltage VSS. Because the DCC integrator 1209 is an analog circuit, when a full swinging signal is received, it is not difficult to maintain linearity. Therefore, it is preferable to reduce a swing width by inserting the small swing buffer 1501 as illustrated in FIG. 15B. In FIG. 15B, a simple type where the input and the output of an inverter INV are connected through a resistor R is illustrated. In this case, the swing width is reduced as a resistance value is reduced. Various small swing buffers exist, for example, a small swing buffer using an analog circuit such as a source follower amplifier.

Figure 15:
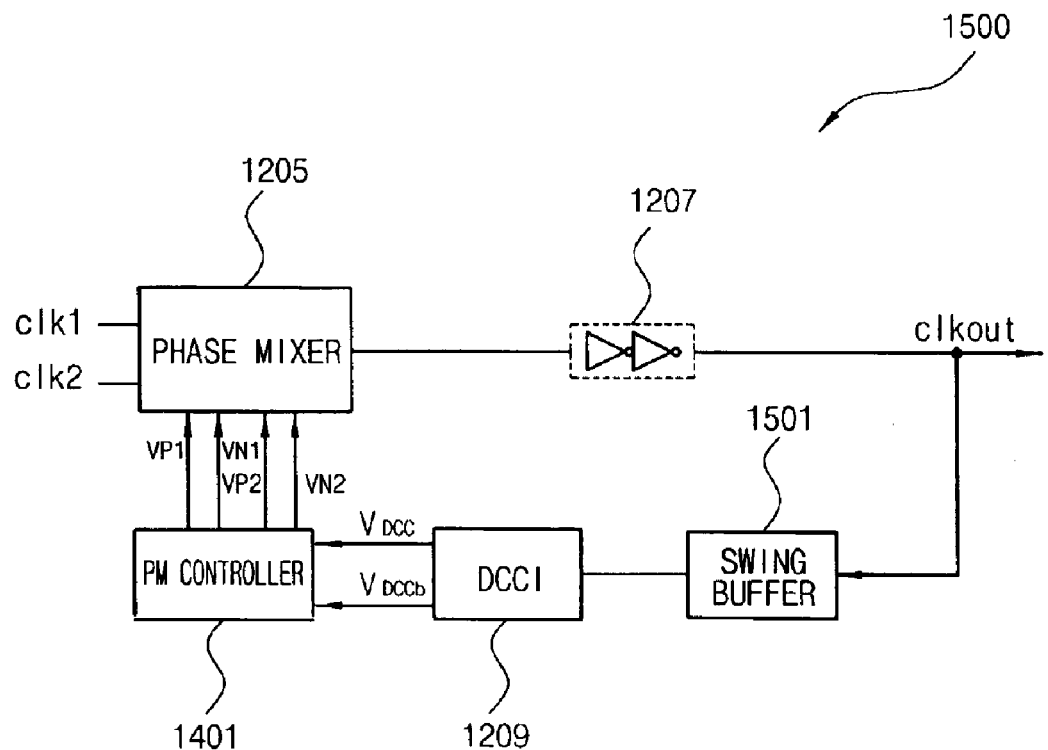
FIG. 15 is a block diagram of still another embodiment where a small swing buffer is added to the DCC loop of FIG. 14 and a circuit diagram of the small swing buffer.
Figure 15:
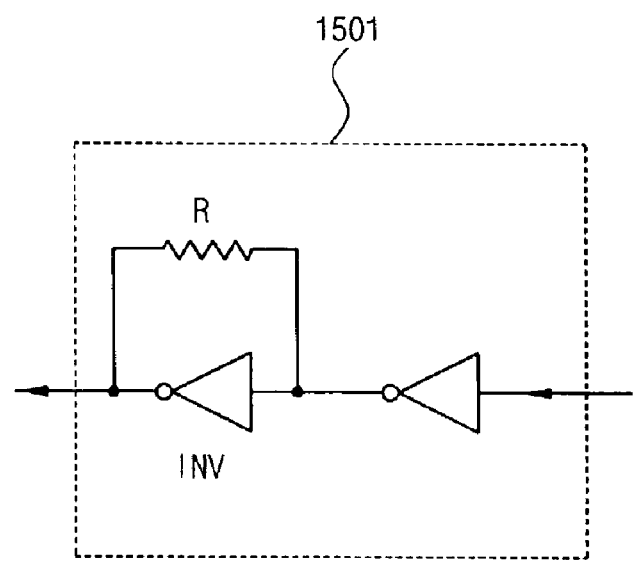

FIG. 16A is a block diagram of still another embodiment where a differential DCC integrator is used for the DCC loop of FIG. 15. FIG. 16B is a circuit diagram of an example of a phase splitter of FIG. 16A. In the DCC integrator, in order to remove influences such as noise, it is preferable to use a differential circuit. Because the output clock clkout is a non-differential signal, a DLL circuit 1600a makes the output clock clkout differential signals CO and COb using a phase splitter 1601 and provides the differential signals CO and COb to a differential DCC integrator 1603. Because the differential DCC integrator 1603 is a well-known circuit, detailed description thereof will be omitted. As illustrated in FIG. 16B, the phase splitter may include a passgate 1605 and an inverter 1607. It is important to reduce a delay difference between the passgate 1605 and the inverter 1607 for a correct phase split operation. Also, as previously illustrated in relation to FIG. 15, in order to maintain linearity, it is preferable to reduce swing of an output clock from the phase splitter using small swing buffers 1609 and 1611 and to provide the output clock to the DCC integrator 1603.

Therefore, when a phase splitter 1600b illustrated in FIG. 16B is used, a non-differential signal changes the output clock clkout to the differential signals CO and COb of small swing and provides the differential signals CO and COb to the differential DCC integrator 1603.

Figure 16:
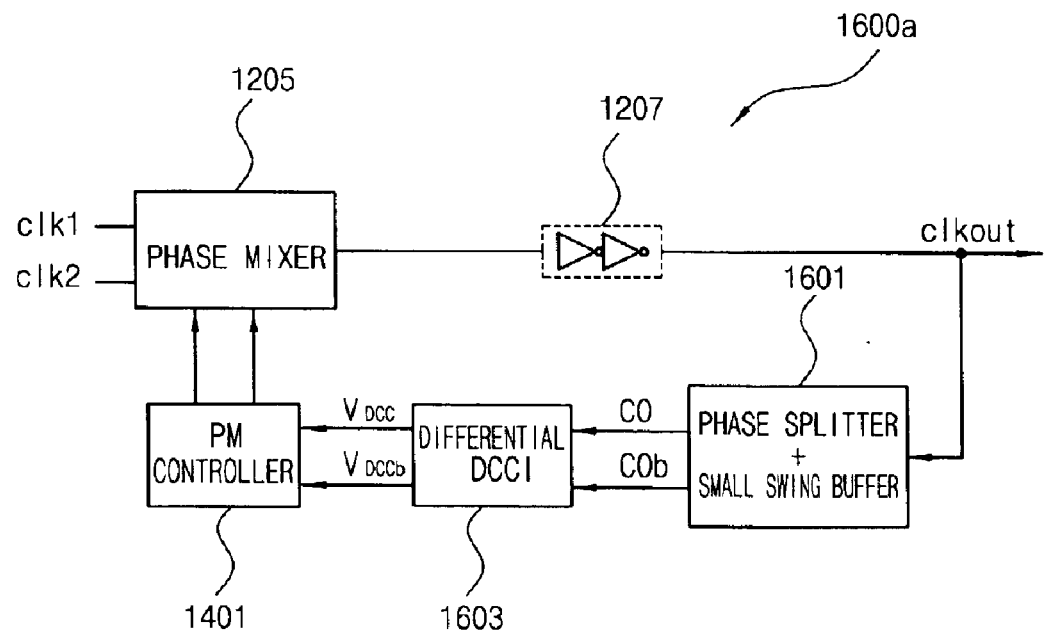
FIG. 16 is a block diagram of still another embodiment where a differential DCC integrator is used for the DCC loop of FIG. 15 and a circuit diagram of a phase splitter.
Figure 16:
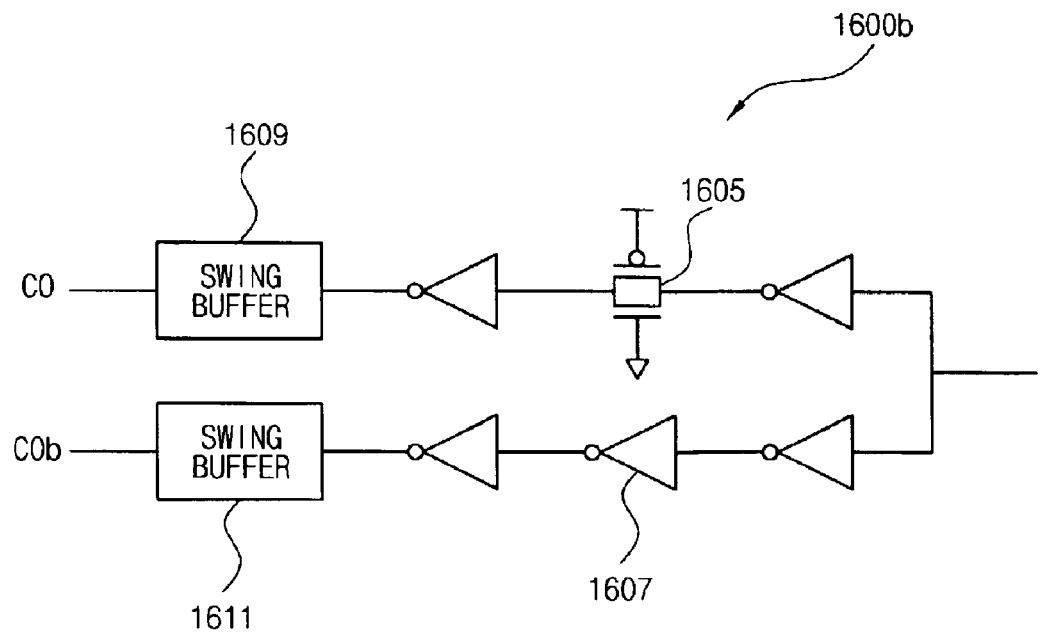
Figure 17:
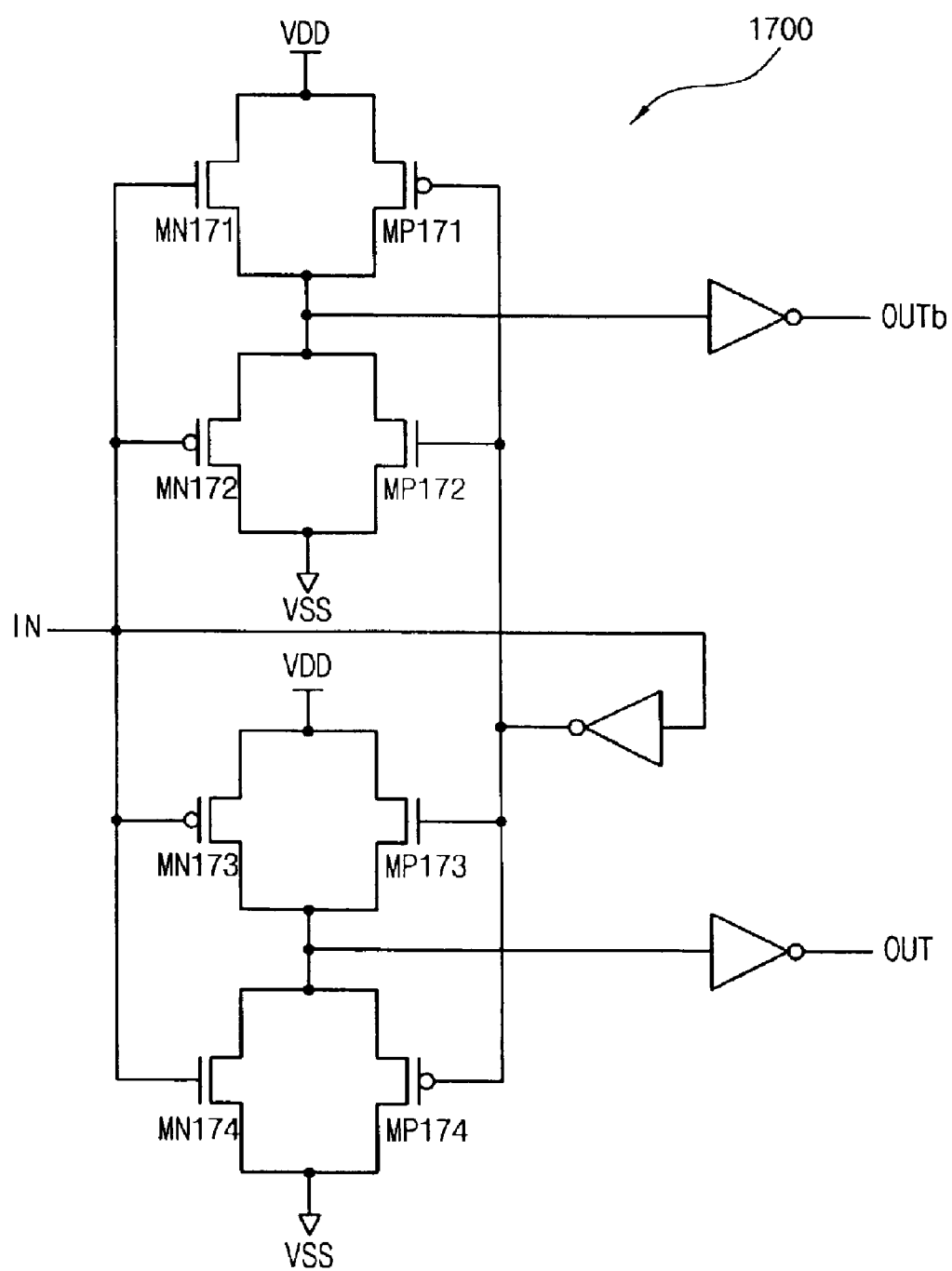
FIG. 17 is a circuit diagram of another example of the phase splitter in FIG. 16.

FIG. 17 is a circuit diagram of another embodiment of the phase splitter in FIG. 16. In FIG. 17, when an input signal IN is at a high level, an NMOS transistor MN171 and a PMOS transistor MP172 and an NMOS transistor MN174 and a PMOS transistor MP174 are turned on. Therefore, an output OUT outputs a high level signal. An output OUTb outputs a low level signal. When the input signal IN is at a low level, a PMOS transistor MP172 and an NMOS transistor MN172 and a PMOS transistor MP173 and an NMOS transistor MN173 are turned on. Accordingly, the output OUT outputs a low level signal. The output OUTb outputs a high level signal. That is, a phase splitter 1700 outputs the differential signals OUT and OUTb that change according to the level of the input signal IN. The phase splitter 1700 can create a desirable differential signal only by controlling the values of a transistor and an inverter.

Figure 18:
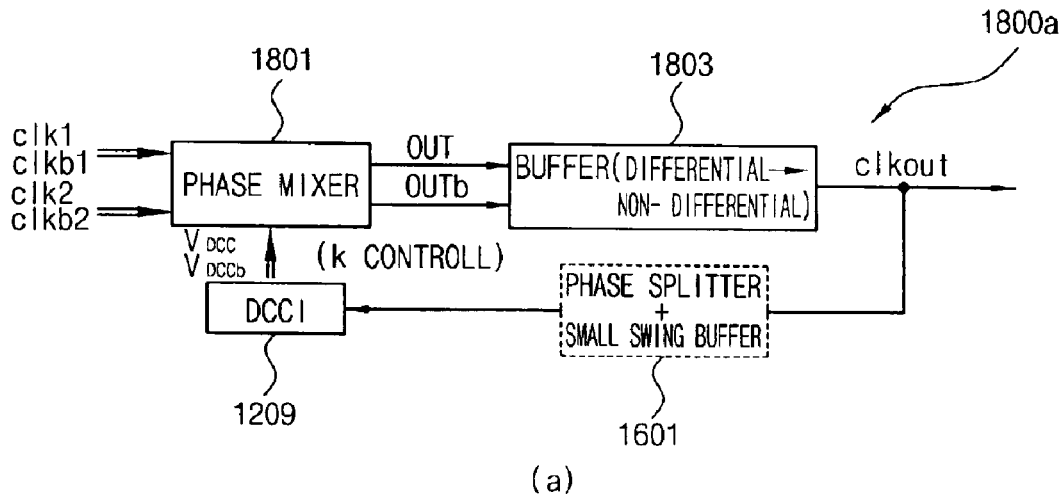
FIG. 18 is a modification using a phase mixer of a differential method for the DCC loop of FIG. 12, a block diagram where only a phase mixer is performing according to a differential method, a block diagram where a phase mixer and a buffer are a differential method, and a circuit diagram of a phase mixer a differential method.
Figure 18:
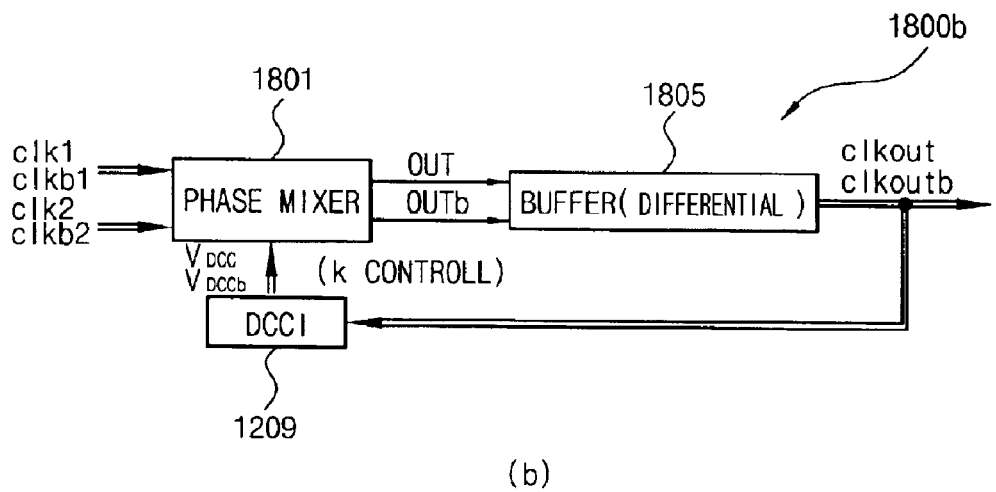
Figure 18:
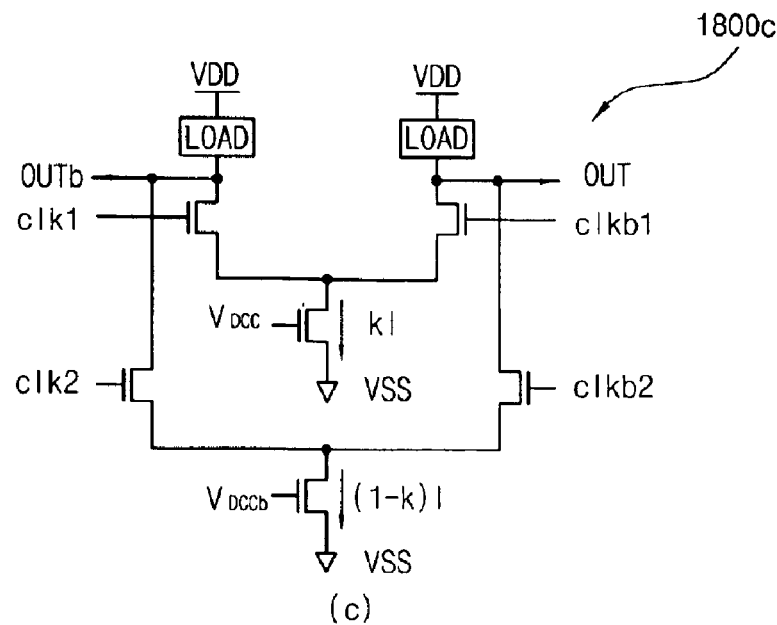

FIG. 18 is a modification using a phase mixer of a differential method in the DCC loop of FIG. 12. FIG. 18A is a block diagram when only a phase mixer is operating according to a differential method. FIG. 18B is a block diagram when a phase mixer and a buffer are all operating according to a differential method. FIG. 18C is a circuit diagram of the phase mixer according to the differential method. In the above embodiments, a phase mixer 1801 uses the non-differential signals clk1 and clk2 as inputs. However, in the present embodiment, the phase mixer 1801 uses the differential signals clk1, clkb1, clk2, and clkb2 as inputs. A buffer 1803 receives the differential outputs OUT and OUTb of the phase mixer 1801 and generates the non-differential signal clkout. Meanwhile, a buffer 1805 generates the differential signals clkout and clkoutb.

As illustrated in FIG. 18C, the signal $V_{DCC}$ from the DCC integrator 1209 and 1603 is provided to the gate of an NMOS transistor 1807 and controls current kI, to thus determine a degree to which the phases of the clocks clk1 and clkb1, provided by the first DLL, affect the phases of the output clocks OUT and OUTb. Meanwhile, the signal $V_{DCCb}$ is provided to the gate of an NMOS transistor 1809 and controls current (1−k)I, to thus determine a degree to which the phases of the clocks clk2 and clkb2, provided by the second DLL, affect the phases of the output clocks OUT and OUTb. For example, when the signal $V_{DCC}$ is larger than the signal $V_{DCCb}$, the phases of the output clocks OUT and OUTb follow the phases of the clocks clk1 and clkb1. When the signal $V_{DCCb}$ is larger than the signal $V_{DCC}$, the phases of the output clocks OUT and OUTb follow the phases of the clocks clk2 and clkb2.

Although a preferred embodiment of the present invention has been described for illustrative purposes, those skilled in the art will appreciate that various modifications, additions and substitutions are possible, without departing from the scope and spirit of the invention as disclosed in the accompanying claims.

According to the present invention, the first conventional method of performing DCC using the two DLLs and the intermediate phase composer is combined with the second conventional method of performing DCC by forming a closed loop using a negative feedback. Therefore, it is possible to adopt the advantages of the two methods. That is, according to the DLL circuit of the present invention, it is possible to obtain a locking time longer than in the first method but shorter than in the second method. Also, according to the DLL of the present invention, it is possible to obtain correctness as high as the correctness of the second method. Also, according to the DLL of the present invention, applicable bandwidth can be wider in comparison to the two conventional methods.

What is claimed is:

1. A delay locked loop (DLL) circuit with a duty cycle correction (DCC) function, comprising:
    a first DLL for receiving an external clock signal and generating a first clock signal synchronized with the external clock signal;
    a second DLL for receiving an external clock signal and generating a second clock signal synchronized with the external clock signal;
    an intermediate phase generation circuit for receiving the first and second clock signals and generating an intermediate phase clock signal having an intermediate phase between those of the first and second clock signals; and
    a DCC loop for receiving the intermediate phase clock signal and generating an output clock signal obtained by correcting a duty cycle of the intermediate phase clock signal using a value obtained by integrating the output clock signal.

2. The DLL circuit as claimed in claim 1, wherein the second clock signal is an inverted signal of the first clock signal.

3. The DLL circuit as claimed in claim 1, wherein a start edge of a level having a duty of (50−Δ)% in the first clock signal end a start edge of a level having a duty of (50+Δ)% in the second clock signal are generated at the same point of time.

4. The DLL circuit an claimed in claim 1, wherein the DCC loop comprisers:
    a DCC integrator for receiving and integrating the output clock signal, to thus generate a duty cycle control signal; and
    a DCC amplifier for receiving the intermediate phase clock signal and generating an interval adjusted clock signal obtained by separately amplifying the high interval and the low interval of the intermediate phase clock signal according to the duty cycle control signal.

5. The DLL circuit as claimed in claim 4, wherein the DCC amplifier amplifies the high interval of the intermediate phase clock signal more than the low interval according to the duty cycle control signal.

6. The DLL circuit as claimed in claim 4, wherein the DCC loop generates level-adjusted clock signal for letting the absolute values of the high level and the low level have actually the same value in the interval adjusted clock signal by receiving and amplifying the interval adjusted clock signal.

7. The DLL circuit as claimed in claim 4, wherein the duty cycle control signal does not change when the duty of the output clock signal is 50%.

8. The DLL circuit as claimed in claim 1, wherein the first DLL comprises:
    a first delay line for receiving the external clock signal and a first delay control signal and delaying the external clock signal by a delay amount determined by the first delay control signal, to thus generate the first clock signal; and
    a first phase determiner for receiving the external clock signal and the intermediate phase clock signal, generating the first delay control signal representing a phase difference between the external clock signal and the intermediate phase clock signal, and providing the first delay control signal to the first delay line.

9. The DLL circuit as claimed in claim 1, wherein the second DLL comprises:
    a second delay line for receiving the external signal and second delay control signal and delaying the external clock signal by a delay amount determined by the second delay control signal, to thus generate the second clock signal;
    a delay device for receiving the second clock signal and delaying the second clock signal by a delay amount in the intermediate phase generation circuit; and
    a second phase determiner for receiving the external clock signal and the delayed second clock signal, generating the second delay control signal representing a phase difference between the external clock signal and the delayed second clock signal, and providing the second delay control signal to the second delay line.

10. The DLL circuit as claimed in claim 1, further comprising a small swing buffer for generating a small swing output clock signal by receiving the output clock signal and reducing swing width of the output clock signal and providing the small swing output clock signal to the DCC integration circuit as an output clock signal.

* * * * *